United States Patent

Määttä

Patent Number: 5,917,710
Date of Patent: *Jun. 29, 1999

[54] ELECTROMAGNETIC SHIELD ASSEMBLY

[75] Inventor: Matti Määttä, Turku, Finland

[73] Assignee: Nokia Mobile Phones Limited, Salo, Finland

[*] Notice: This patent issued on a continued prosecution application filed under 37 CFR 1.53(d), and is subject to the twenty year patent term provisions of 35 U.S.C. 154(a)(2).

[21] Appl. No.: 08/644,908

[22] Filed: May 10, 1996

[30] Foreign Application Priority Data

May 12, 1995 [GB] United Kingdom ............... 9509619

[51] Int. Cl.$^6$ ........................................................ H05K 9/00
[52] U.S. Cl. ........................ 361/818; 361/753; 361/799; 361/800; 361/816; 174/35 R; 174/35 GC
[58] Field of Search ................................. 206/706, 709; 174/35 R, 35 MS, 35 GC, 35 TS; 361/753, 730, 799, 800, 807, 809, 816, 818, 687, 690, 683–686, 724–727, 814, 212, 220, 796, 810; 277/166, 181

[56] References Cited

U.S. PATENT DOCUMENTS

| 2,065,651 | 12/1936 | Burton | 174/35 GC |
| 4,912,604 | 3/1990 | Vaisanen | 361/424 |
| 4,945,633 | 8/1990 | Hakanen et al. | 29/825 |
| 5,006,667 | 4/1991 | Lonka | 174/35 R |
| 5,271,056 | 12/1993 | Pesola et al. | 379/58 |
| 5,365,410 | 11/1994 | Lonka | 361/816 |
| 5,400,949 | 3/1995 | Hirvonen et al. | 228/180 |
| 5,442,521 | 8/1995 | Hirvonen et al. | 361/800 |
| 5,559,676 | 9/1996 | Gessaman | 361/752 |

FOREIGN PATENT DOCUMENTS

| 0 517 134 A1 | 12/1992 | European Pat. Off. . |
| 1 571 579 | 7/1980 | United Kingdom . |
| 2 268 835 | 1/1994 | United Kingdom . |

Primary Examiner—Leo P. Picard
Assistant Examiner—Phuong T. Vu
Attorney, Agent, or Firm—Perman & Green, LLP

[57] ABSTRACT

An electromagnetic shield assembly for securing a circuit board having an electromagnetic shield; and an electrically-conductive gasket having a framework of planar limbs and opposing first and second projections upstanding laterally from at least one of the limbs to intimately contact side faces of the shield and inhibit movement of the shield in a direction between the first and second projections, wherein the first projection includes a barb engaging a side face of the shield to fasten the gasket to the shield.

8 Claims, 2 Drawing Sheets

ELECTROMAGNETIC SHIELD ASSEMBLY

BACKGROUND OF THE INVENTION

The present invention relates to an electromagnetic shield assembly having particular, but not exclusive, application to the field of radio telephones.

Electromagnetic signals are generated as a by-product during normal operation of an electrical circuit. Such signals are undesirable as the generated signals can interfere with the proper functioning of the circuits. Radio telephones, in particular, are required by law to adhere to ElectroMagnetic Compatibility (EMC) limits as laid down in Type Approval Specifications for Mobile Phones. EMC is defined as the ability of a device to function properly in its intended electromagnetic environment and not to be a source of electromagnetic pollution to that environment.

There exist in the art many approaches to providing shielding.

SUMMARY OF THE INVENTION

The present invention has an object of providing an electromagnetic shield assembly which is of simplified construction and imposes less stringent tolerance specifications on the components making up the assembly.

In one aspect, the present invention provides an electromagnetic shield assembly for securing to a circuit board comprising an electromagnetic shield; and an electrically-conductive gasket comprising a framework of planar limbs and opposing first and second projections upstanding laterally from at least one of the limbs to intimately contact side faces of the shield and inhibit movement of the shield in a direction between the first and second projections, wherein the first projection includes a barb engaging a side face of the shield to fasten the gasket to the shield.

The barb operates by biting or cutting into a side face of the shield.

Preferably, in order to promote firm retention of the shield the second projection may also include a barb.

The first and second projections may upstand from a single one of the planar limbs, or from first and second of the planar limbs.

In order to facilitate the operation of the barb, it may be made of harder material than the shield.

By virtue of the barb, the assembly is more tolerant to dimensional variations between the gasket and the shield, as any discrepancy therebetween is compensated for by the barb biting or cutting into the shield to a greater or lesser extent.

BRIEF DESCRIPTION OF THE DRAWINGS

Exemplary embodiments of the invention are hereafter described with reference to the accompanying drawings, in which:

FIG. 2(*b*) shows a cross-sectional view of the encircled portion Z of FIG. 2(*a*) where its projections have been bent to upstand from the limbs;

FIG. 2(*c*) shows the encircled portion Z of FIG. 2(*a*) in enlarged form;

FIG. 3(*b*) shows a cross-sectional view of the encircled portion X of FIG. 3(*a*) where its projections have been bent to upstand from the limbs;

FIG. 3(*c*) shows the encircled portion X of FIG. 3(*a*) in enlarged form; and

DESCRIPTION OF PREFERRED EMBODIMENTS

Figure 1:
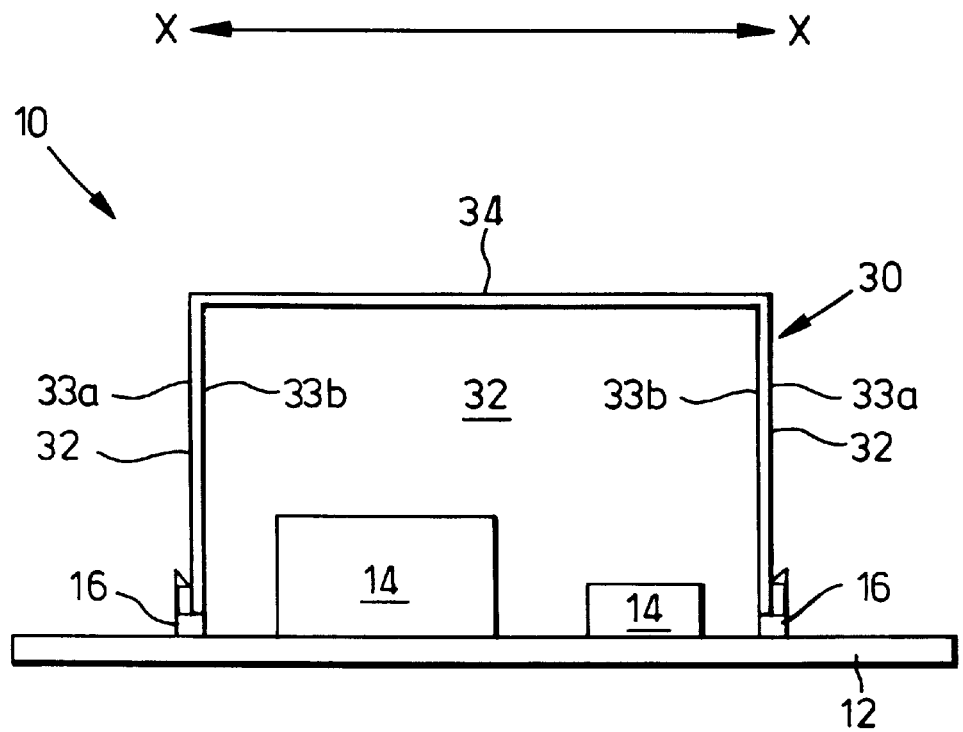
FIG. 1 shows a cross-sectional view of a first embodiment of the invention.

An electromagnetic shield assembly suitable for use in a mobile phone and in accordance with the present invention is generally designated 10. The shield assembly 10 is shown in FIG. 1 secured to a circuit board 12 on which are mounted a number of electronic components 14 which require electromagnetic shielding. These components may require shielding because they emit electromagnetic pollution during normal operation or because they are sensitive to incident electromagnetic radiation and thus require protection.

The shield assembly 10 comprises an electrically-conductive gasket 16 and an electromagnetic shield 30 fastened together. The gasket 16 is shown in greater detail in FIGS. 2(*a*), 2(*b*), 2(*c*). It comprises a network or framework 20 of interconnected planar limbs 22. (Individual limbs are hereinafter referred to by the reference numeral 22 followed by an alphabetic postfix, as shown). Each limb 22 is provided with a plurality of tangs 24 upstanding centrally from the plane of the limbs 22, and each tang 24 is depressible towards the plane of its supporting limb. At various locations on the framework 20, tabs 26 are provided. Referring to FIG. 1, the shield 30 comprises a cover-like membrane having a base 34 from which upstand a plurality of side walls 32 to an open end of the shield. Each wall 32 includes a pair of side faces 33*a*,33*b* and an exposed edge 33*c* at the open end of the shield. The exposed edges 33*c* of the side walls 32 at the open end of the shield define a "footprint" which matches the shape of the framework 20.

Figure 2A:
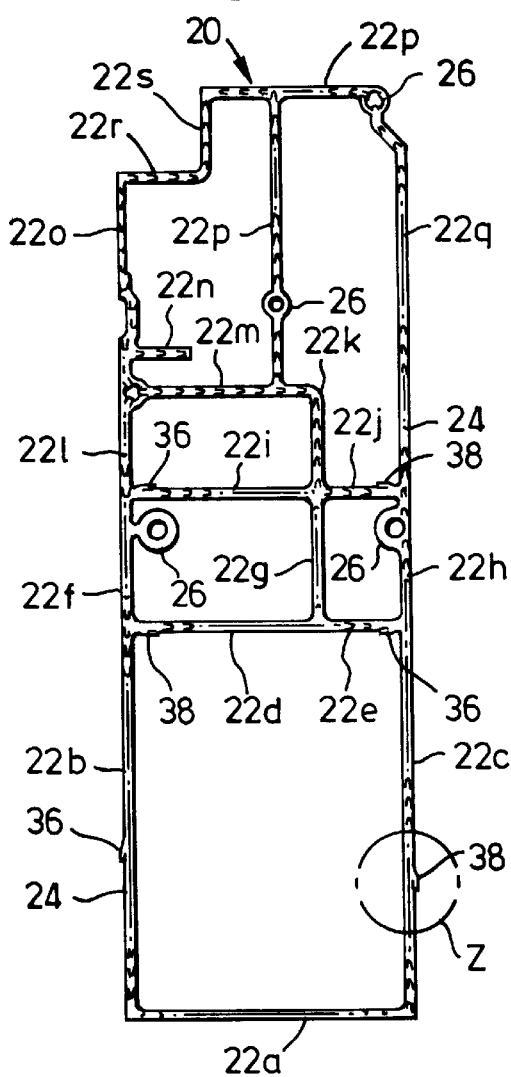
FIG. 2(*a*) shows a plan view of a gasket of the first embodiment, viewed in isolation, where its projections are in an unbent configuration co-planar with the limbs.
Figure 2B:
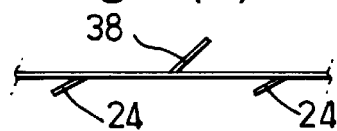
Figure 2C:
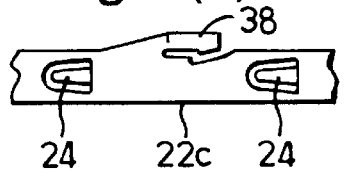

The shield 30 and the gasket 16 are fastened together by aligning the footprint of the shield 30 with the limbs 22 of the framework and push fitting the shield into engagement with a number of pairs of opposing projections formed on selected pairs of limbs. In FIG. 2(*a*), a pair of projections 36,38 is formed on limbs 22*d* and 22*i*; 22*e* and 22*j*; and 22*b*, 22*c*. As the arrangement and function of the pairs of projections 36,38 in holding the shield is identical, only the pair of projections 36,38 formed on limbs 22*b*, 22*c* will be described in any greater detail.

The projections 36,38 are laterally disposed on the side of the major axes of the respective limbs 22*b*, 22*c* which locates them outside the area between the limbs. The projections 36,38 upstand from the plane of the respective limbs 22*b*, 22*c* in opposing relation to each other so as to form a jaw-like arrangement. The spacing between the projections 36,38 is such that faces 33*a* of the opposed side walls 32, as best seen in FIG. 1, are in intimate contact with the projections, whereby the projections 36,38 inhibit movement of the shield in a direction between the opposing projections 36,38, as illustrated by double-headed arrow X. Each projection 36,38 includes a barb 40 for biting into face 33*a* of the side wall 32 of the shield 30, to thereby hold fast the shield.

In a variation of this first embodiment (not shown), the projections 36,38 may both be laterally disposed on the side of the major axes of the respective opposed limbs which locates them in the area between the opposed limbs. Such projections may also be in intimate contact with the side wall 32 and inhibit movement of the shield, as described above, but are also housed completely within the shield.

Figure 4:
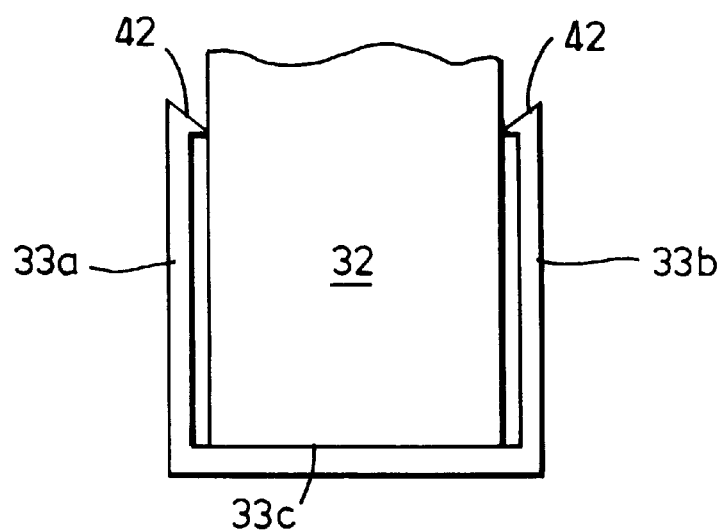
FIG. 4 shows, in the second embodiment, the barbs engaging a side wall of the shield.
Figure 3A:
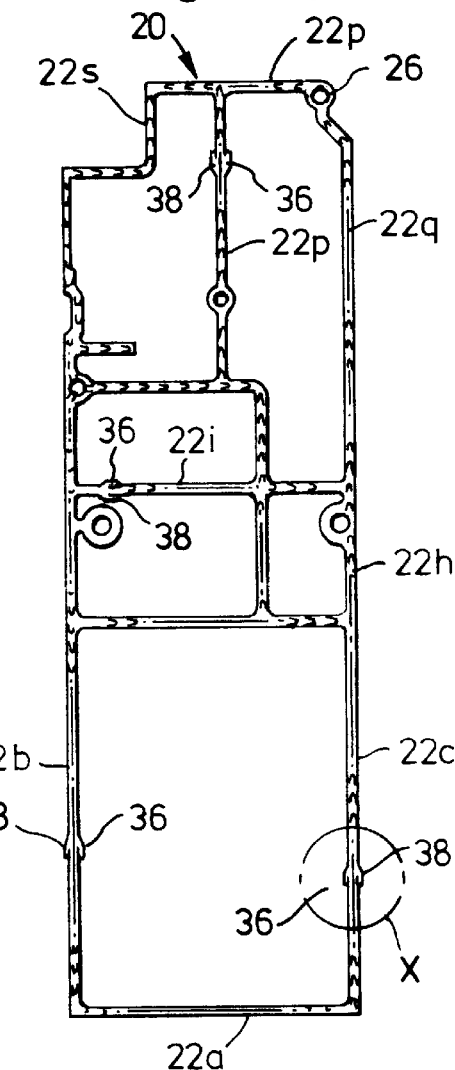
FIG. 3(*a*) shows a plan view of the gasket for a second embodiment of the invention, where its projections are in an unbent configuration co-planar with the limbs.
Figure 3B:
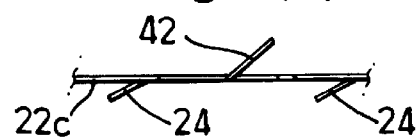
Figure 3C:
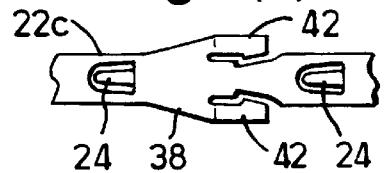

A gasket of a second embodiment of the invention is shown in FIGS. 3(*a*), 3(*b*) and 3(*c*). This embodiment differs from the first embodiment in that each pair of opposing projections 36,38 upstand laterally from a respective single limb. In FIG. 3(*a*), pairs of opposing projections 36,38 upstand laterally from limbs 22*b*, 22*c*, 22*i* and 22*p*. Each projection 36,38 comprises a barb 42 which engages a side face 33*a*, 33*b* of a side wall 32. The engagement of the barbs 42 with side faces of a particular wall 32 of the shield is shown in more detail in FIG. 4.

The spacing of the projections 36,38 enables the biting or cutting action of the barbs to hold the shield very firmly in place, sufficiently firmly, in fact, to permit the supply of the assembly in a manufacturing process, absent any further means, such as adhesive, keeping the shield and gasket together.

The assembly 10 is secured to the circuit board 12 by known securing means (not shown) which pass through aligned holes formed in the base 34 of the shield, the circuit board 12 (both not shown) and holes in the tabs 26 of the gasket 16 (FIGS. 2(*a*), 3(*a*)).

As is known in the art, the function of the tangs 24 is to provide adequate electromagnetic sealing between the gasket 16 and the circuit board 12. Without the tangs 24, it is possible due to warp in the circuit board 12 for gaps to exist between the gasket 16 and the circuit board 12 which are of sufficient dimension for practically significant electromagnetic leakage to occur through the gaps. The gasket 16 is usually connected to a ground plane or some other fixed voltage plane.

It is a preferred feature of the first and second embodiments that the barbs 40,42 are made of a harder material than the shield in order to facilitate the biting of the barbs 40,42 into the shield. Suitable materials for the shield include aluminium, magnesium with a chromium coating or metallised plastic. A suitable material for the gasket is hardened stainless steel.

The gaskets and shields of the preferred embodiments are advantageous in that they are very simple to manufacture. For example, the shield is very simple to mould requiring only a natural mould. Further, the gasket can be etched and only requires a very simple tool for effecting bending in two directions (i.e. the tangs 24 and the projections 36,38).

In the context of the present specification, the term 'opposing' is to be construed broadly. For example, in relation to the first embodiment of the invention (FIG. 2(*a*)), projections on limbs 22*s* and 22*q*; 22*j* and 22*a*; and 22*m* and 22*e* are to be considered as opposing. By way of further example, in relation to the second embodiment of the invention, opposing projections need not be located at the same longitudinal point along a limb, but may also be longitudinally offset from one another.

We claim:

1. An electromagnetic shield assembly comprising a circuit board and a shield, the shield having at least one side wall defined by a pair of side faces each of said side faces defining an exposed edge extending in a given plane, said shield being mounted on the circuit board by means including:

a gasket providing electromagnetic sealing therebetween and comprising a planar framework of limbs which extends on the surface of the circuit board in a plane extending parallel to the circuit board and extends parallel to the given plane of the exposed edge of the shield, said planar framework of limbs being disposed between the exposed edge of said shield and the circuit board, the gasket further having opposing first and second projections upstanding from and extending away from said at least one of the limbs in opposite directions therefrom to intimately contact the side faces of the shield and inhibit movement of the shield in a direction between said first and second projections, and said first projection engaging with and piercing one of said side faces of the shield to fasten the gasket to the shield.

2. An assembly as defined in claim 1 further characterized by said framework of limbs having a first and an opposite second surface, said first surface facing said shield and said second surface facing said circuit board, said first surface being sized and shaped to match the size and shape of said exposed edge of said shield at least one side wall and being placed in confrontation therewith when said first projection engages with and fastens the gasket to the shield.

3. An assembly as in claim 1, wherein the second projection includes a barb engaging a face of the shield to fasten the gasket to the shield.

4. As assembly as in claim 1, wherein the barb is made from harder material than the shield.

5. An assembly as in claim 1, wherein the projections are bent out of a plane which includes an associated limb.

6. A gasket suitable for the assembly as in claim 1.

7. An electromagnetic shield assembly for securing a circuit board comprising:

an electromagnetic shield, said shield having at least one side wall defined by a pair of side faces each of said side faces defining an exposed edge extending in a given plane;

and an electrically-conductive gasket comprising a framework of planar limbs extending on the surface of the circuit board in a plane extending parallel to the circuit board and extending in a plane parallel to said given plane and located between said circuit board and said exposed edge of said shield side wall, first and second integrally formed projections upstanding laterally outwardly in opposite directions away from at least one of the limbs to intimately contact the side faces of the shield and inhibit movement of the shield in a direction between the first and second projections, wherein the first projection includes a barb engaging with and piercing a side face of the shield at least one side wall to fasten the gasket to the shield.

8. An assembly as defined in claim 7 further characterized by said framework of limbs having a first and an opposite second surface, said first surface facing said shield and said second surface facing said circuit board, said first surface being sized and shaped to match the size and shape of said exposed edge of said shield at least one side wall and is placed in confrontation therewith when said barb engages with and fastens the gasket to the shield.

* * * * *